US008618873B2

(12) United States Patent
Kajii

(10) Patent No.: US 8,618,873 B2
(45) Date of Patent: Dec. 31, 2013

(54) HIGH FREQUENCY CIRCUIT DEVICE

(71) Applicant: Sumitomo Electric Device Innovations, Inc., Yokohama (JP)

(72) Inventor: Kiyoshi Kajii, Yokohama (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 0 days.

(21) Appl. No.: 13/665,092

(22) Filed: Oct. 31, 2012

(65) Prior Publication Data

US 2013/0106503 A1 May 2, 2013

(30) Foreign Application Priority Data

Oct. 31, 2011 (JP) .................................. 2011-239672

(51) Int. Cl.
*H01L 25/00* (2006.01)
(52) U.S. Cl.
USPC .......................................... 327/565; 327/559
(58) Field of Classification Search
USPC .................. 327/551, 552, 559, 564, 565, 566
See application file for complete search history.

(56) References Cited

U.S. PATENT DOCUMENTS

| 5,233,310 | A * | 8/1993 | Inoue ............................. 330/277 |
| 6,771,119 | B2 * | 8/2004 | Ochi .............................. 327/552 |
| 7,394,331 | B2 * | 7/2008 | Yeung et al. ................. 333/28 R |
| 8,076,767 | B2 * | 12/2011 | Uno et al. ..................... 257/686 |

FOREIGN PATENT DOCUMENTS

JP 7-38120 A 2/1995

* cited by examiner

*Primary Examiner* — Jeffrey Zweizig
(74) *Attorney, Agent, or Firm* — Westerman, Hattori, Daniels & Adrian, LLP

(57) ABSTRACT

A high frequency circuit device includes: two transmission lines having ends which are opposed to each other and are spaced from each other; a capacitor that is mounted on the end of one of the two transmission lines and has a lower face electrode acting as a mount face and an upper face electrode positioned higher than the lower face electrode; a resistor element that is provided on a region between the ends of the two transmission lines and connects the ends of the two transmission lines; and a connection conductor electrically connecting the upper face electrode of the capacitor and the other of the two transmission lines.

12 Claims, 7 Drawing Sheets

TOP VIEW

CROSS SECTIONAL VIEW

TOP VIEW

CROSS SECTIONAL VIEW

TOP VIEW

CROSS SECTIONAL VIEW

HIGH FREQUENCY CIRCUIT DEVICE

CROSS-REFERENCE TO RELATED APPLICATION

This application is based upon and claims the benefit of priority of the prior Japanese Patent Application No. 2011-239672, filed on Oct. 31, 2011, the entire contents of which are incorporated herein by reference.

BACKGROUND (i) Technical Field

The present invention relates to a high frequency circuit device, in particular, relates to an internally matched transistor device.

(ii) Related Art

An internally matched transistor device has a structure in which a matching circuit for matching between impedance of a FET (Field Effect Transistor) and impedance of an outer transmission line acting as a connection objective is provided in a package in which the FET is provided. For example, the internally matched transistor device is used for a wireless communication device such as a base station of a mobile communication network. Japanese Patent Application Publication No. 7-38120 discloses an internally matched transistor device structuring an amplifier.

SUMMARY

It is an object to provide a high frequency circuit device of which electrical characteristic is improved.

According to an aspect of the present invention, there is provided a high frequency circuit device including: two transmission lines having ends which are opposed to each other and are spaced from each other; a capacitor that is mounted on the end of one of the two transmission lines and has a lower face electrode acting as a mount face and an upper face electrode positioned higher than the lower face electrode; a resistor element that is provided on a region between the ends of the two transmission lines and connects the ends of the two transmission lines; and a connection conductor electrically connecting the upper face electrode of the capacitor and the other of the two transmission lines.

DETAILED DESCRIPTION

An oscillation-preventing circuit of an internally matched transistor device is connected to an outer component in order to prevent an oscillation in a low frequency band. Although the oscillation-preventing circuit prevents the oscillation, the oscillation-preventing circuit may inhibit downsizing of a device in which an internally matched transistor device is mounted and may cause degradation of characteristics of insertion loss and return loss in a high frequency band.

A description will be given of a best mode for carrying the present invention.

Figure 1:
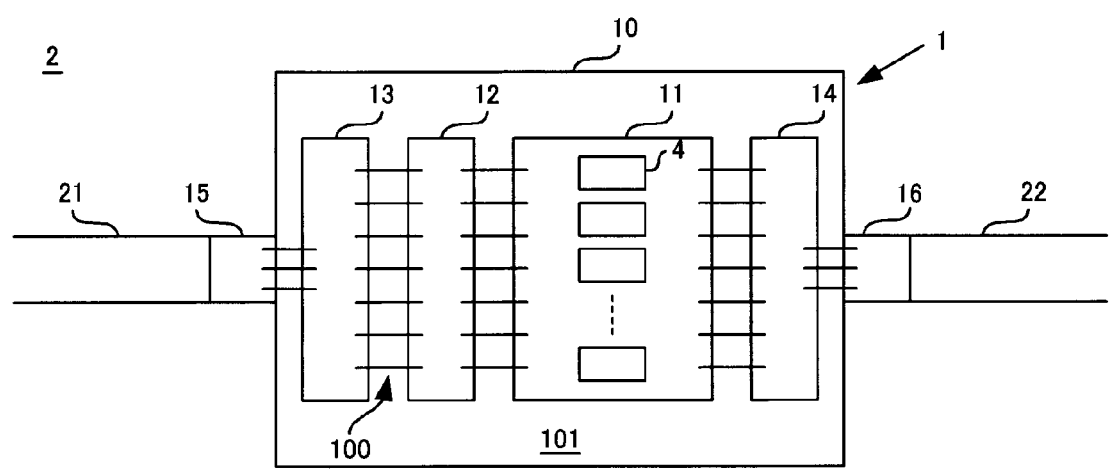
FIG. 1 illustrates a top view of an internal structure of a high frequency circuit device.

FIG. 1 illustrates a top view of an internal structure of a high frequency circuit device. An internally matched transistor device 1 acting as the high frequency circuit device has a package substrate 10, an input terminal 15 and an output terminal 16. The input terminal 15 and the output terminal 16 are respectively connected to a transmission line 21 and a transmission line 22 of a printed circuit substrate 2 on which the internally matched transistor device 1 is mounted. A signal transmitted from the transmission line 21 is input into the input terminal 15, is amplified, and is output to the transmission line 22 from the output terminal 16.

The package substrate 10 has a structure in which a metal layer including a metal such as copper is laminated on an insulating layer including an insulating material such as ceramics. The package substrate 10 may be made only of a metal layer in order to improve thermal radiation characteristic. The package substrate 10 has a rectangular shape or the like and has an FET circuit 11, an input matching circuit 12, an output matching circuit 14 and an oscillation-preventing circuit 13. Each of the circuits 11 to 14 is covered by a metal case made of aluminum or the like.

The FET circuit 11, the input matching circuit 12, the output matching circuit 14 and the oscillation-preventing circuit 13 are independently provided from each other and are bonded to a surface of a metal layer 101 of the package substrate 10 by an adhesive agent such as a solder. The metal layer 101 acts as a ground electrode (that is, GND). The FET circuit 11, the input matching circuit 12, the output matching circuit 14 and the oscillation-preventing circuit 13 are electrically connected to each other by more than one bonding wire 100.

The FET circuit 11 includes one or more FET 4. The FET circuit 11 including a plurality of FETs 4 is referred to as a multi finger type FET.

The input matching circuit 12 and the output matching circuit 14 include inductance elements or capacitor elements and achieves impedance matching between the input terminal 15 and the FET 4 and between the FET 4 and the output terminal 16. In concrete, the input matching circuit 12 and the output matching circuit 14 achieve matching between input-output impedance of the FET 4 and characteristic impedance of the transmission lines 21 and 22. The oscillation-preventing circuit 13 includes a resistor element and a capacitor element and prevents an oscillation of the FET 4 in a low frequency band.

Figure 2:
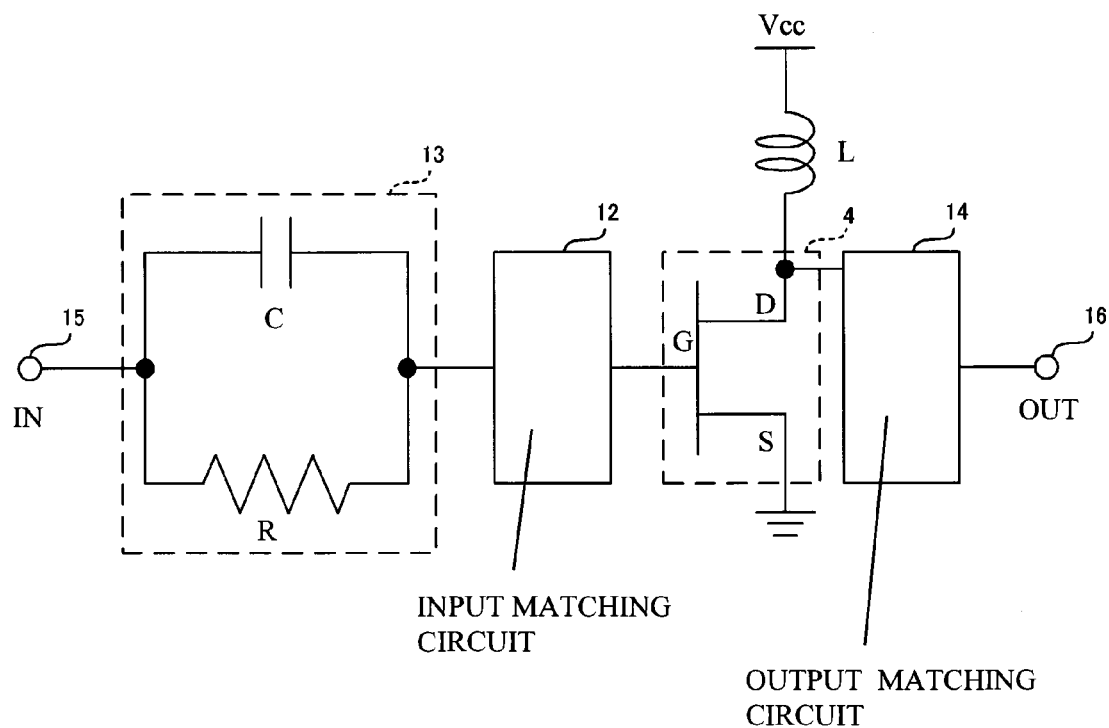
FIG. 2 illustrates an electrical structure of a high frequency circuit device.

FIG. 2 illustrates an electrical structure of the internally matched transistor device 1. In FIG. 2, only one FET 4 is illustrated for simplification of explanation.

The oscillation-preventing circuit 13 is an RC circuit in which a resistor element R and a capacitor element C are connected in parallel. A first end of the oscillation-preventing circuit 13 is connected to the input terminal 15, and a second end of the oscillation-preventing circuit 13 is connected to the input matching circuit 12. The resistor element R reduces intensity of a low frequency component of a transmit signal.

On the other hand, the capacitor element C allows passage of a high frequency component of the transmit signal by cutting the low frequency component.

In the embodiment, the oscillation-preventing circuit 13 is connected to between the input terminal 15 and the input matching circuit 12. However, the structure is not limited. The oscillation-preventing circuit 13 has only to be connected to a transmission line from the input terminal 15 and a gate electrode G of the FET 4. For example, the oscillation-preventing circuit 13 may be connected to between the input matching circuit 12 and the gate electrode G of the FET 4. The structure is not limited. The oscillation-preventing circuit 13 may be integrated with the input matching circuit 12 or the FET circuit 11.

The gate electrode G of the FET 4 is connected to the input matching circuit 12. A source electrode S of the FET 4 is grounded. A drain electrode D of the FET 4 is connected to the output matching circuit 14. The drain electrode D is connected to a power supply Vcc via a choke coil L. With the structure, in the internally matched transistor device 1, the FET 4 amplifies a signal input from the input terminal 15 and outputs the amplified signal to the output terminal 16.

Figure 3:
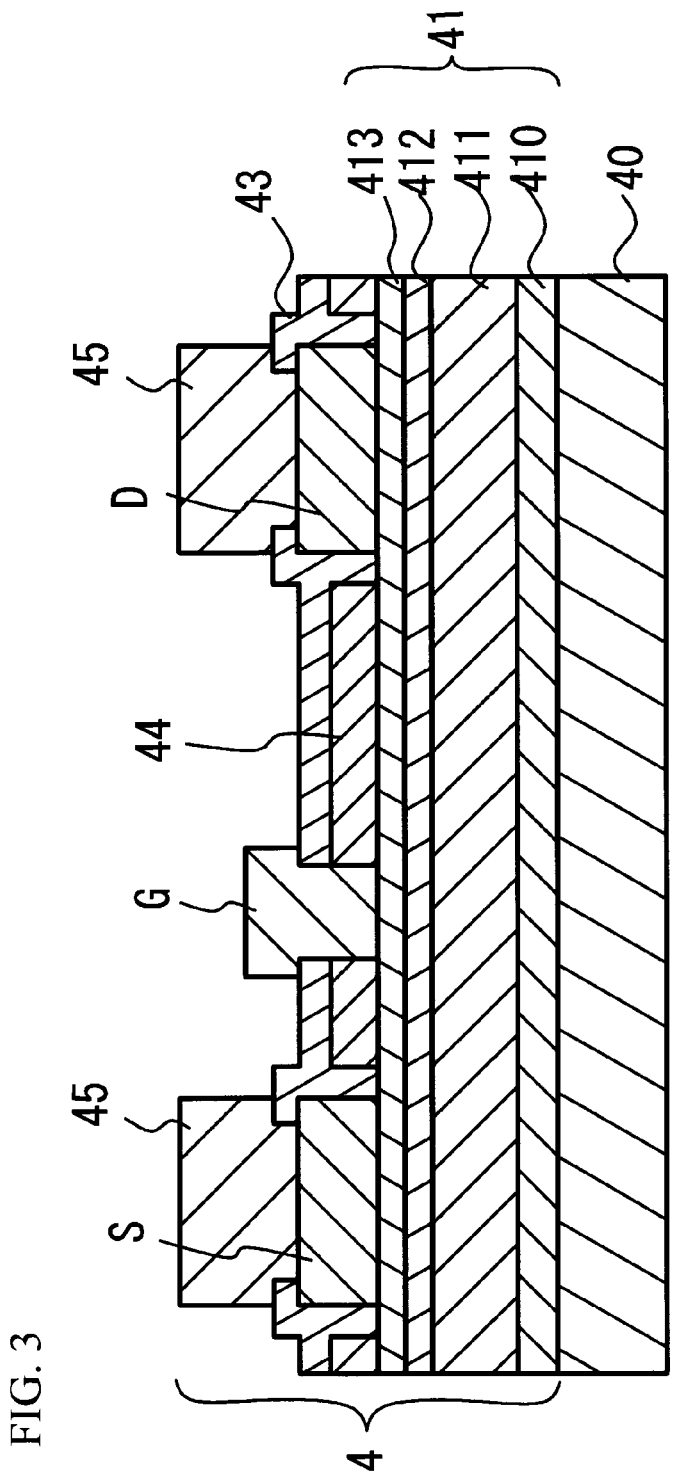
FIG. 3 illustrates a cross sectional view of an FET.

FIG. 3 illustrates a cross sectional view of the FET 4. The FET 4 is provided on a face of an FET substrate 40 and has a semiconductor nitride layer 41, a SiN layers 43 and 44, an interconnection line layer 45, the gate electrode G, the source electrode S and the drain electrode D. The semiconductor nitride layer 41 includes a barrier layer 410, a channel layer 411, an electron supply layer 412, and a cap layer 413. For example, the FET substrate 40 includes one of Si (silicon), SiC (silicon carbide), GaN (gallium nitride), and a sapphire.

The barrier layer 410 is, for example, made of AlN (aluminum nitride) having a thickness of 300 nm. The channel layer 411 is, for example, made of i-type GaN (gallium nitride) having a thickness of 1000 nm. The electron supply layer 412 is, for example, made of a AlGaN (aluminum gallium nitride) having a thickness of 20 nm. The cap layer 413 is, for example, made of n-type GaN having a thickness of 5 nm.

The SiN layers 43 and 44 act as an insulating layer. A thickness of the SiN layer 43 is 40 nm or the like. A thickness of the SiN layer 44 is 20 nm or the like. The interconnection line layer 45 is, for example, made of a metal such as Au.

The source electrode S and the drain electrode D are an ohmic electrode and have a structure in which either Ti and Al or Ta and Al are laminated in this order. On the other hand, the gate electrode G has a structure in which Ni and Au are laminated in this order.

Each layer and each electrode of the FET 4 is formed by a thin-film formation method such as an epitaxial growth method, a plasma CVD (Chemical Vapor Deposition) method, a sputtering method or a vapor deposition method, a printing method, a plating method or a combined method thereof.

The semiconductor nitride included in the FET 4 may be InN, AlN, InGaN, InAlN, GaInN, InAlGaN or the like other than the GaN and the AlGaN mentioned above. On the other hand, the FET 4 may include a GaAs (gallium arsenic) based semiconductor such as GaAs, AlGaAs, InGaAs, or InGaAlAs.

It is preferable that the oscillation-preventing circuit 13 acts as a micro strip line acting as a high frequency transmission line by forming an interconnection line pattern on an insulating substrate and sandwiching the insulating substrate (dielectric material) between the interconnection line pattern and the metal layer 101 in order to maintain the characteristic impedance. The impedance of the micro strip line is determined in accordance with a frequency of a signal transmitted to the outer transmission lines 21 and 22. Thus, a line width of the interconnection line patter is determined. For example, when a signal in GHz band is transmitted to the transmission lines 21 and 22, it is preferable that the characteristic impedance is set to be 50Ω. In this case, the line width is approximately 0.5 mm to 1.0 mm. When the resistor element R and the capacitor element C are arranged in parallel with each other so that the resistor element R and the capacitor element C are within the line width, a chip resistor and a chip capacitor having a relatively small size (length of 0.6 mm and width of 0.3 mm) may be used. In the following description, the micro strip line is referred to as an interconnection line or an interconnection line pattern.

A total sum of the widths of the chip resistor and the chip capacitor occupies 0.6 mm of the line width of the interconnection line pattern. In this case, only 0.4 mm or so can be secured at a maximum as a width required for mounting in a width direction of the interconnection line pattern. Therefore, a problem of a manufacturing such as decreasing of yield ratio may occur. Further, there is a problem that loss of a transmit signal increases, because the width of the chip capacitor is greatly different from the line width of the interconnection line pattern.

Figure 4A:
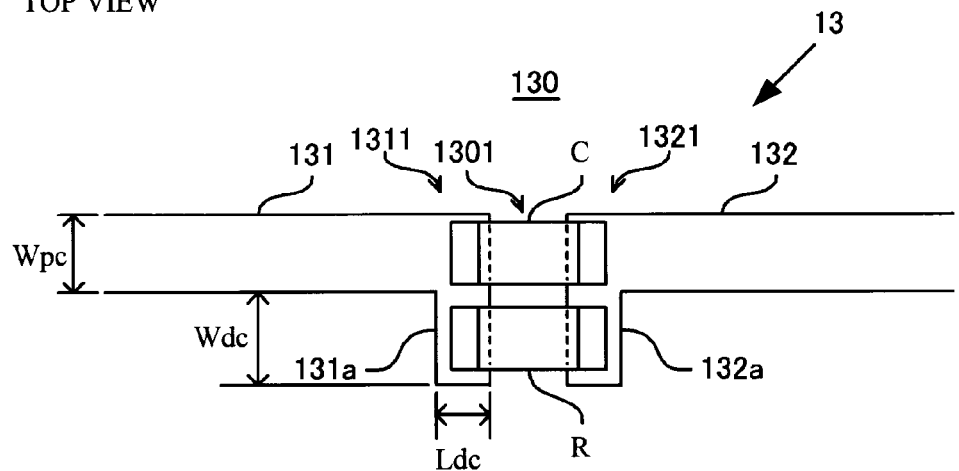
FIG. 4A illustrates a top view of an oscillation-preventing circuit in accordance with a comparative example.
Figure 4B:
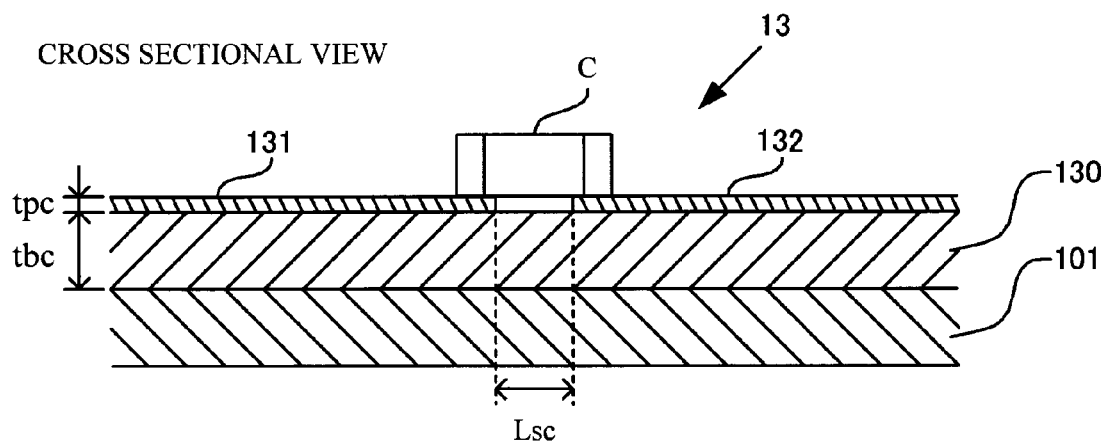
FIG. 4B illustrates a cross sectional view of the oscillation-preventing circuit.

And so, as in the case of the oscillation-preventing circuit 13 illustrated in FIG. 4A and FIG. 4B, it is thought that two interconnection line patterns 131 and 132 are formed on a dielectric substrate 130, an end portion 1311 of the interconnection line pattern 131 faces an end portion 1321 of the interconnection line pattern 132 at an interval 1301, and widths of the end portions 1311 and 1321 of the interconnection line patterns 131 and 132 are enlarged. When the resistor R and the capacitor C are mounted with use of width-enlarged portions 131a and 132a, a chip resistor and a chip capacitor having a size of which width is approximately the same as that of the interconnection line patterns 131 and 132 (for example, length: 1.0 mm, width: 0.5 mm) can be adopted. In this case, a sufficient interval required for mounting can be secured in the width direction of the interconnection line patterns 131 and 132.

However, the line width of the interconnection line patterns 131 and 132 partially fluctuates because of the width-enlarged portions 131a and 132a. Therefore, there is a problem that signal characteristic such as insertion loss or return loss may be degraded.

Figure 5A:
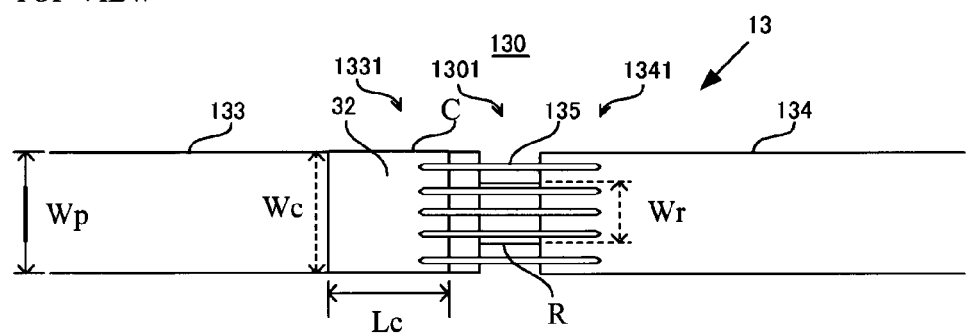
FIG. 5A illustrates a top view of an oscillation-preventing circuit in accordance with an embodiment.
Figure 5B:
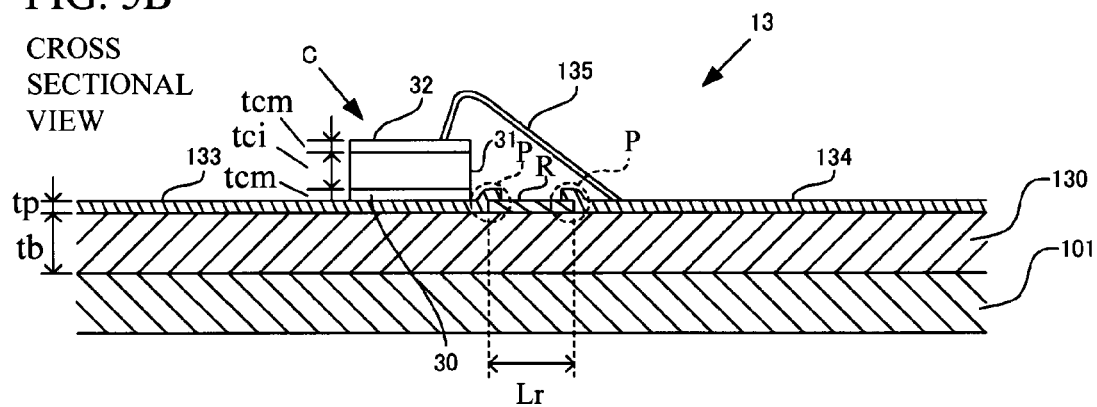
FIG. 5B illustrates a cross sectional view of the oscillation-preventing circuit.

The oscillation-preventing circuit 13 illustrated in FIG. 5A and FIG. 5B is structured so as to solve the above-mentioned problem. The oscillation-preventing circuit 13 includes two interconnection line patterns 133 and 134, the capacitor C, the thin film resistor element R and a connection conductor 135.

The interconnection line patterns 133 and 134 are an interconnection line formed by vapor-depositing a metal such as gold, copper or aluminum on the insulating substrate 130 made of an insulating material such as alumina ($Al_2O_3$). As mentioned above, the insulating substrate 130 is laminated on the metal layer 101 of the package substrate 10. The micro strip line is structured because the insulating layer 130 is sandwiched by the interconnection line patterns 133 and 134 and the metal layer 101.

The two interconnection line patterns 133 and 134 have a straight line shape having a constant width or substantially have a straight line shape. End portions of the interconnection line patterns 133 and 134 face with each other at a given interval. In concrete, an end portion 1331 of the interconnection line pattern 133 faces an end portion 1341 of the interconnection line pattern 134 at the interval 1301. And, the other end portion of the interconnection line pattern 133 is connected to the input terminal 15, and the other end portion of the interconnection line pattern 134 is connected to the input matching circuit 12. For example, the other end portion of the interconnection line pattern 134 is connected to each terminal of the input matching circuit 12 via the bonding wire 100, and the other end portion of the interconnection line pattern 133 is connected to each terminal of the input terminal 15 via another bonding wire 100, as illustrated in FIG. 1. When the oscillation-preventing circuit 13 is provided between the FET circuit 11 and the input matching circuit 12, the end portion of the interconnection line pattern 133 is connected to the input matching circuit 12, and the end portion of the interconnection line pattern 134 is connected to the gate electrode G of the FET 4. In any of these cases, the end portion of the interconnection line pattern 133 is directly or indirectly connected to the input terminal 15, and the end portion of the interconnection line pattern 134 is directly or indirectly connected to the gate electrode G of the FET 4.

In the embodiment, the two interconnection line patterns 133 and 134 are located on an identical straight line at the interval 1301. However, the structure is not limited. For example, the two interconnection line patterns 133 and 134 may be located at a right angle. The line widths of the interconnection line patterns 133 and 134 are substantially equal to each other and are 0.5 mm to 1.0 mm or the like, as mentioned above.

The capacitor C is mounted on the end portion 1331 of the interconnection line pattern 133 that is one of the two interconnection line patterns and has an upper electrode layer 32, a lower electrode layer 30 and a capacitor structure 31. In the capacitor C, the lower electrode layer 30 acts as a lower face. That is, the lower electrode layer 30 acts as a mount face. Therefore, the upper electrode layer 32 is located at a higher position than the lower electrode layer 30. That is, the upper electrode layer 32 acts as an upper face electrode, and the lower electrode layer 30 acts as a lower face electrode.

The capacitor structure 31 has a structure in which a plurality of internal electrodes connected to the upper electrode layer 32 or the lower electrode layer 30 face with each other. The structure is generally called a laminate capacitor. The capacitor structure 31 may be made of a single dielectric material, and the upper electrode layer 32 and the lower electrode layer 30 may act as a facing electrode of a capacitor. The structure is generally called an MIM (Metal-Insulator-Metal) capacitor. The capacitor structure 31 is properly selected in accordance with a required capacitance.

The dielectric material structuring the capacitor structure 31 is barium titanate ($BaTiO_3$), titanium oxide ($TiO_2$) or the like. The upper electrode layer 32 and the lower electrode layer 30 may be a thin film conductor made of a metal such as gold. The upper electrode layer 32 and the lower electrode layer 30 can be formed by performing a gold plating.

A width of the capacitor C is the width of the interconnection line patterns 133 and 134 or less. It is preferable that the width of the capacitor C is equal to that of the interconnection line patterns 133 and 134 or is substantially equal to that of the interconnection line patterns 133 and 134, in order to suppress the loss of a transmit signal caused by the changing of the width mentioned above. Further, the electrical characteristic of the capacitor C does not depend on the transmission direction of a signal on the interconnection line patterns 133 and 134. Therefore, the capacitor C may be provided on any of the end portions 1331 and 1341 of the interconnection line patterns 133 and 134. That is, the capacitor C may be provided on any of the interconnection line pattern 133 connected to the input terminal 15 and the interconnection line pattern 134 connected to the input matching circuit 12.

The lower electrode layer 30 is laminated on an upper portion of the end portion 1331 of the interconnection line pattern 133 and is electrically connected to the interconnection line pattern 133. The lower electrode layer 30 is bonded to the end portion 1331 of the interconnection line pattern 133 by an adhesive agent such as Au-Sn solder.

On the other hand, the upper electrode layer 32 is connected to the end portion 1341 of the interconnection line pattern 134 via the connection conductor 135. The connection conductor 135 is a bonding wire made of a metal such as gold. The upper electrode layer 32 and the interconnection line pattern 134 are connected by the bonding wire.

In concrete, above the thin film resistor element R, the wire 135 passes over the interval 1301 of the interconnection line patterns 133 and 134 and connects the upper electrode layer 32 and the interconnection line pattern 134. It is preferable that the wire 135 is short and the number of the wire 135 is large, in order to reduce the resistance value and the inductance of the wire 135. That is, it is preferable that whole width of the interconnection line patterns 133 and 134 are bonded by the wires 135. And, there is a difference between a height of the upper electrode layer 32 and a height of the interconnection line pattern 134. Therefore, the wire 135 is bent and bonded so as to absorb the difference. The connection conductor 135 is not limited to the above structure. The connection conductor 135 may be a metal thin film such as a ribbon.

The thin film resistor element R connects the end portions 1331 and 1341 in the interval 1301 between the interconnection line patterns 133 and 134. The thin film resistor element R is located in the region between the end portions 1331 and 1341, has a rectangular shape, and is made of tantalum nitride or the like on the insulating substrate 130. The resistance value of the thin film resistor element R is determined by a low frequency component of a transmit signal and is, for example, 1Ω to 10Ω. The shape and the width of the thin film resistor element R are not limited when the thin film resistor element R achieves the oscillation preventing function.

Both of end portions P of the thin film resistor element R respectively overlaps with the interconnection line patterns 133 and 134. Therefore, the overlapping portion of the interconnection line pattern 133 is raised. The capacitor C is arranged on a region of the interconnection line pattern 133 except for the overlapping portion.

Figure 6A:
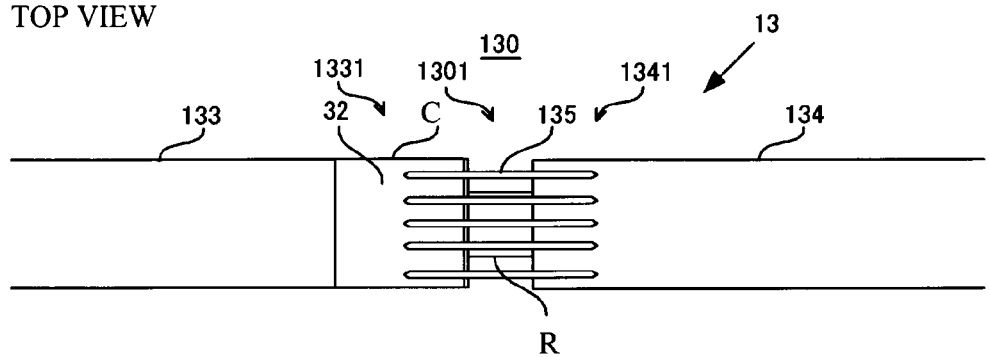
FIG. 6A illustrates a top view of an oscillation-preventing circuit in accordance with another embodiment.
Figure 6B:
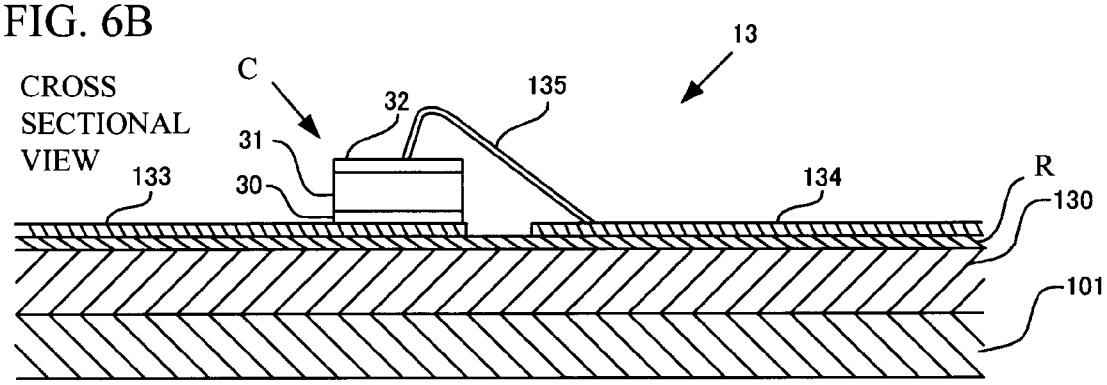
FIG. 6B illustrates a cross sectional view of the oscillation-preventing circuit.

In order to get rid of the raised portion, the thin film resistor element R may be provided under the whole of the interconnection line patterns 133 and 134, as in the case of the oscillation-preventing circuit 13 in FIG. 6A and FIG. 6B. In this case, the interconnection line patterns 133 and 134 are provided on the thin film resistor element R extending on the insulating substrate 130, except for the interval 1301. Therefore, the resistor element exists in the region between the end portions 1331 and 1341 in a resistor layer R provided in the region including the under region of the interconnection line patterns 133 and 134. In the embodiment, whole of the interconnection line patterns 133 and 134 overlap with the thin film resistor element R. Therefore, the interconnection line patterns 133 and 134 have a plane without a raised portion. Thus, there is no limitation of location of the capacitor C.

In the internally matched transistor device 1 described above, the oscillation-preventing circuit 13 includes the two interconnection line patterns 133 and 134, the capacitor C, the thin film resistor element R and the connection conductor 135. The capacitor C has the structure in which the dielectric layer 31 is sandwiched by the upper electrode layer 32 and the lower electrode layer 30, and thereby has a low height lamination structure. Therefore, the lower electrode layer 30 can be laminated on the end portion 1331 of the interconnection line pattern 133.

On the other hand, the thin film resistor element R connects the end portion 1331 of the interconnection line pattern 133 and the end portion 1341 of the interconnection line pattern 134 in the interval 1301. The thin film resistor element R is a thin film. Therefore, the thin film resistor R does not need a large mount space. Therefore, the upper electrode layer 32 can be connected to the end portion 1341 of the interconnection line pattern 134 via the connection conductor 135.

The two interconnection line patterns 133 and 134 have a straight line shape having a constant width. It is therefore possible to suppress the loss of a transmit signal caused by the line width fluctuation. That is, the width of the interconnection line patterns 133 and 134 is not enlarged for a component-mounting. Therefore, the degradation of the characteristic of the interconnection line patterns 133 and 134 acting as a high frequency transmission line is prevented.

The upper electrode layer 32 of the capacitor C is connected to the interconnection line pattern 134 facing the upper electrode layer 32 via the connection conductor 135 such as a bonding wire. The number of the connection conductor 135 is two or more. The connection conductors 135 are provided in the whole width of the interconnection line pattern 134. Therefore, the transmission characteristic of a high frequency signal transmitted in the connection conductor 135 is preferable.

In the embodiment, the resistor element R has a width smaller than that of the interconnection line patterns 133 and 134. However, the resistor element R is mainly affected by a relatively low frequency component of the transmit signal in the RC parallel circuit. The influence caused by the structure in which the width of the resistor element R is smaller than that of the interconnection line patterns 133 and 134 is relatively small.

Figure 7:
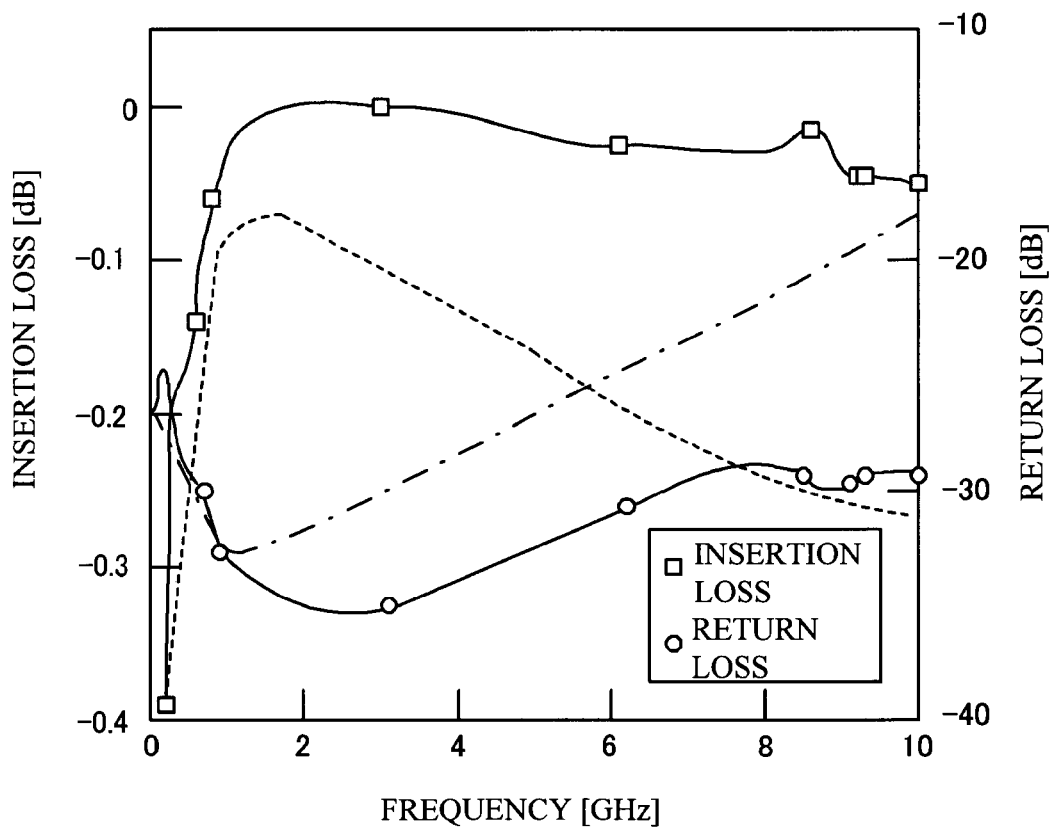
FIG. 7 illustrates a graph of insertion loss and return loss of a high frequency circuit device based on a simulation.

Next, a description will be given of the electrical characteristic of the internally matched transistor device 1 in accordance with the embodiment. FIG. 7 illustrates a graph of the insertion loss and the return loss of the internally matched transistor device 1 based on a simulation. In the graph, a line connecting square marks and a line connecting circle marks respectively indicate the insertion loss and the return loss based on the embodiment illustrated in FIG. 5A and FIG. 5B. On the other hand, a dotted line and a dashed line respectively indicate the insertion loss and the return loss based on the comparative example illustrated in FIG. 4A and FIG. 4B.

Simulation conditions of the embodiment of FIG. 5A and FIG. 5B are as follows.
Material of the substrate 130: alumina
Dielectric constant $\epsilon p$ of the substrate 130: 9.9
Thickness tb of the substrate 130: 500 μm
Material of the interconnection line patterns 133 and 134: gold
Thickness tp of the interconnection line patterns 133 and 134: 4 μm
Width Wp of the interconnection line patterns 133 and 134: 500 μm
Dielectric constant cc of the capacitor C: 4000
Length Lc×width Wc of the capacitor C: 500 μm×500 μm
Thickness tci of the dielectric layer 31: 0.1 μm
Material of the upper electrode layer 32 and the lower electrode layer 30: gold
Thickness tcm of the upper electrode layer 32 and the lower electrode layer 30: 4 μm
Sheet resistance value Rs of the thin film resistor element R: 5Ω
Length Lr×width Wr of the thin film resistor element R: 200 μm×200 μm
Simulation conditions of the comparative example of FIG. 4A and FIG. 4B are as follows.
Material of the substrate 130: alumina
Dielectric constant $\epsilon pc$ of the substrate 130: 9.9
Thickness tb of the substrate 130: 500 μm
Material of the interconnection line patterns 131 and 132: gold
Thickness tpc of the interconnection line patterns 131 and 132: 4 μm
Base width Wpc of the interconnection line patterns 131 and 132: 500 μm
Enlarged width Wdc of the interconnection line patterns 131 and 132: 700 μm
Length Ldc of the width-enlarged portion of the interconnection line patterns 131 and 132: 200 μm
Interval Lsc of the interconnection line patterns 131 and 132: 600 μm
Capacitance cc of the laminate capacitor C: 100 pF
Resistance value rc of the chip resistor R: 5Ω
Length×width of the laminate capacitor C and the chip resistor R: 1000 μm×500 μm (JIS (Japanese Industrial Standards) 1005 size)

As apparent from FIG. 7, the insertion loss of the internally matched transistor device 1 in accordance with the embodiment illustrated in FIG. 5A and FIG. 5B is reduced compared to the comparative example illustrated in FIG. 4A and FIG. 4B, and the return loss of the internally matched transistor device 1 is improved compared to the comparative example. In particular, the return loss is greatly improved in the high frequency band of 7 to 10 GHz. The internally matched transistor device 1 of FIG. 6A and FIG. 6B has the same structure as FIG. 5A and FIG. 5B, and thereby has similar electrical characteristic.

In the internally matched transistor device 1 described above, the oscillation-preventing circuit 13 is provided on the package substrate 10 in common with the other circuits 11, 12 and 14. Therefore, a circuit structure around the internally matched transistor circuit is simplified, and a mount space of a device to which the internally matched transistor device 1 is applied can be omitted.

The present invention is not limited to the specifically disclosed embodiments and variations but may include other embodiments and variations without departing from the scope of the present invention.

What is claimed is:

1. A high frequency circuit device comprising:
    two transmission lines having ends which are opposed to each other and are spaced from each other;
    a capacitor that is mounted on the end of one of the two transmission lines and has a lower face electrode acting as a mount face and an upper face electrode positioned higher than the lower face electrode;
    a resistor element that is provided on a region between the ends of the two transmission lines and connects the ends of the two transmission lines; and
    a connection conductor electrically connecting the upper face electrode of the capacitor and the other of the two transmission lines.

2. The high frequency circuit device as claimed in claim 1 wherein:
    a resistor layer is located under the two transmission lines and a spaced region between the two transmission lines; and
    the resistor element is a region between the ends of the two transmission lines.

3. The high frequency circuit device as claimed in claim 1 wherein a width of the capacitor is substantially equal to or smaller than a width of the two transmission lines.

4. The high frequency circuit device as claimed in claim 1 wherein the two transmission lines extend on an identical line.

5. The high frequency circuit device as claimed in claim 1, wherein the connection conductor is a plurality of bonding wires provided in a whole width of the transmission line.

6. The high frequency circuit device as claimed in claim 1, wherein the capacitor has an MIM (Metal-Insulator-Metal) structure.

7. The high frequency circuit device as claimed in claim 1, wherein a dielectric material of the capacitor is comprised of barium titanate or titanium oxide.

8. The high frequency circuit device as claimed in claim 1, further comprising an input terminal and FET, wherein the capacitor and the resistor element are connected between the input terminal and the FET in parallel.

9. The high frequency circuit device as claimed in claim 1, wherein the resistor element is located under the connection conductor.

10. The high frequency circuit device as claimed in claim 1, wherein the resistor element is located at extension of the two transmission lines.

11. The high frequency circuit device as claimed in claim 1, wherein one of the end of the transmission lines is connected to a one end of the resistor element and another one of the end of the transmission lines is connected to an another end of the resistor element.

12. The high frequency circuit device as claimed in claim 1, wherein the connection conductor is a plurality of bonding wires connected between the upper face electrode and the other of the end of the two transmission lines.

* * * * *